(12) United States Patent
Lv et al.

(10) Patent No.: US 9,730,350 B2
(45) Date of Patent: Aug. 8, 2017

(54) ELECTRICAL EQUIPMENT, INTEGRATED CIRCUIT'S LOOP THEREOF AND CIRCUIT CONNECTING METHOD

(71) Applicant: Shenzhen Sigma Microelectronics Co., Ltd., Shenzhen (CN)

(72) Inventors: Lun Lv, Shenzhen (CN); Lifa Wu, Shenzhen (CN)

(73) Assignee: SHENZHEN SIGMA MICROELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 14/727,485

(22) Filed: Jun. 1, 2015

(65) Prior Publication Data
US 2016/0212873 A1   Jul. 21, 2016

(30) Foreign Application Priority Data
Jan. 20, 2015 (CN) .......................... 2015-10028249

(51) Int. Cl.
 H05K 7/00 (2006.01)
 H05K 13/00 (2006.01)
 H05K 13/04 (2006.01)
(52) U.S. Cl.
 CPC ......... H05K 7/005 (2013.01); H05K 13/0092 (2013.01); H05K 13/04 (2013.01)
(58) Field of Classification Search
 CPC ................................... H01L 23/49; H05K 7/02
 See application file for complete search history.

(56) References Cited

U.S. PATENT DOCUMENTS

| | | | | |
|---|---|---|---|---|
| 5,761,804 A | * | 6/1998 | Adachi | H05K 7/005 264/272.11 |
| 8,736,043 B2 | * | 5/2014 | Konno | H01L 29/417 257/693 |
| 2003/0231473 A1 | * | 12/2003 | Otaki | H05K 1/0242 361/777 |
| 2008/0144299 A1 | * | 6/2008 | Redmond | H05K 1/0286 361/764 |
| 2011/0216490 A1 | * | 9/2011 | Ohno | H05K 7/00 361/679.01 |

(Continued)

*Primary Examiner* — Zachary M Pape
*Assistant Examiner* — Douglas Burtner
(74) *Attorney, Agent, or Firm* — Knobbe, Martens, Olson & Bear LLP

(57) ABSTRACT

The invention discloses electrical equipment, an integrated circuit's loop thereof and a circuit connecting method. The integrated circuit's loop includes: a passive component part, including a power device and/or an execution device; and one or more electrical components, each of the electrical components including a body and multiple pins, wherein at least one pin extends to an electrical connecting end of the passive component part, and is electrically connected with the electrical connecting end. In the integrated circuit's loop of the invention, the pins of the electrical components extend to electrical connecting ends of the passive component part, and are electrically connected with the electrical connecting ends, so that the electrical components are not required to be arranged on a Printed Circuit Board (PCB), a physical structure of the circuit configuration is simplified, a size of the circuit is reduced, and the technician is not required to design the PCB.

8 Claims, 3 Drawing Sheets

(56) References Cited

U.S. PATENT DOCUMENTS

| | | | |
|---|---|---|---|
| 2013/0082283 A1* | 4/2013 | Otsuki | H01L 24/49 257/77 |
| 2013/0314888 A1* | 11/2013 | Chall | H01L 23/041 361/807 |
| 2014/0192497 A1* | 7/2014 | Isobe | G02F 1/13452 361/759 |
| 2015/0131024 A1* | 5/2015 | Sakamoto | G02F 1/13452 349/58 |
| 2015/0189784 A1* | 7/2015 | Hirano | H01L 25/072 361/728 |
| 2015/0237727 A1* | 8/2015 | Spang | H05K 1/111 361/767 |
| 2015/0305188 A1* | 10/2015 | Maeda | H05K 7/1432 361/728 |

* cited by examiner

ELECTRICAL EQUIPMENT, INTEGRATED CIRCUIT'S LOOP THEREOF AND CIRCUIT CONNECTING METHOD

TECHNICAL FIELD OF THE INVENTION

The disclosure relates to the field of electrical equipment, in particular to electrical equipment, an integrated circuit's loop thereof and a circuit connecting method.

BACKGROUND OF THE INVENTION

In a present art, a semiconductor is widely applied to electrical equipment such as an ordinary household electrical appliance and specialized equipment as a component, a Printed Circuit Board (PCB) for mounting a semiconductor component is required to be specially designed for a circuit with the semiconductor component, and other parts of the electrical equipment are connected to the PCB, and then are electrically connected with the semiconductor component.

However, for some electrical equipment such as a timing buzzer, the circuit configuration is simple, and is only provided with a power supply, an integrated chip and sound production equipment, and if a PCB is independently designed for the integrated chip, more waste may be caused, the circuit configuration is complicated, and the miniaturization design of the electrical equipment is disadvantaged. If pins of the chip are shorter (shorter than or equal to 15 mm), it is necessary to prolong the pins to be connected to passive equipment by virtue of wires or other parts (PCB), so that the design and manufacturing cost of the electrical equipment is increased.

SUMMARY OF THE INVENTION

A main purpose of the disclosure is to provide electrical equipment, an integrated circuit's loop thereof and a circuit connecting method, so as to solve the problems of complex structure and larger size of a circuit configuration to which a semiconductor component is connected through a PCB in the prior art.

In order to achieve the purpose, according to an aspect of the disclosure, it provides an integrated circuit's loop, which comprises: a passive component part, including a power device and/or an execution device; and one or more electrical components, each of the electrical components including a body and multiple pins, wherein at least one pin extends to an electrical connecting end of the passive component part, and is electrically connected with the electrical connecting end.

Furthermore, the integrated circuit's loop comprises multiple electrical components, and the multiple electrical components are connected through the pins.

Furthermore, at least one pin extends to the electrical connecting end of the passive component part after being bent at least once, and is electrically connected with the electrical connecting end.

Furthermore, the execution device comprises any one or a combination of multiple of a motor, a sensor, a photographic device, a display device, a sound recording device, a sound reproduction device, a luminous device and a heating device.

Furthermore, each of the electrical components comprises a semiconductor component.

Furthermore, each of the pins of each of the electrical components comprises a first section, the first sections are connected with the body of the electrical component, and extend towards the same direction, and the first sections of at least two pins are different in length.

Furthermore, at least one pin of the electrical components is longer than 15 mm.

Furthermore, the pin is connected with the electrical connecting end in a splicing, clamping or welding way.

According to another aspect of the disclosure, electrical equipment is also provided, which comprises an integrated circuit's loop, wherein the integrated circuit's loop is the abovementioned integrated circuit's loop.

Furthermore, the electrical equipment further comprises a support part, and the support part supports the pins.

Furthermore, the electrical equipment further comprises a shell, and the support part is formed on the shell.

According to another aspect of the disclosure, it also provides a circuit connecting method for the integrated circuit's loop. The integrated circuit's loop comprising: electrical component which comprises a body and multiple pins; and a passive component part which comprises a power device and/or an execution device. The circuit connecting method comprises: arranging at least one pin of the electrical component by a way that the pin extends to an electrical connecting end of the passive component part and is electrically connected with the electrical connecting end.

Furthermore, the circuit connecting method further comprises: bending the pin once or for many times to enable the pin to extend to the electrical connecting end of the passive component part and be electrically connected with the electrical connecting end.

In the integrated circuit's loop of the disclosure, the pins of the electrical components extend to electrical connecting ends of the passive component part, and are electrically connected with the electrical connecting ends, so that the electrical components are not required to be arranged on a PCB, electrical connection with the passive component part through the PCB is also avoided, the physical structure of the circuit configuration is simplified, a size of the circuit is reduced, Bill of Material (BOM) cost is lowered, a requirement on a technician is lowered, and the technician is not required to design the PCB.

BRIEF DESCRIPTION OF THE DRAWINGS

The drawings forming a part of the disclosure are adopted to provide further understanding of the disclosure, and the schematic embodiments and description of the disclosure are adopted to explain the disclosure, and do not form improper limits to the disclosure. In the drawings.

Figure 1:
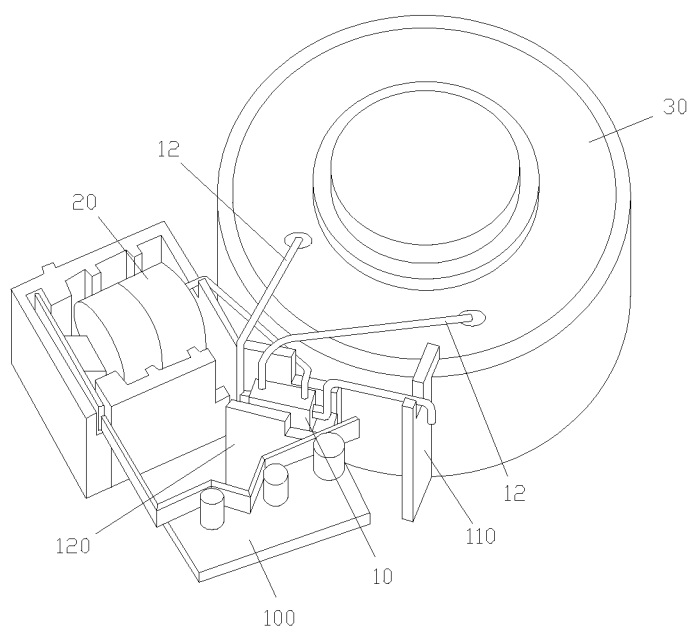
FIG. 1 is a section view of electrical equipment according to an embodiment of the disclosure.

References in the drawings: 10, electrical component; 11, body; 12, pin; 121, first section; 20, power device; 30, execution device; 100, shell; 110, support part; and 120, mounting plate.

DETAILED DESCRIPTION OF THE EMBODIMENTS

It should be noted that the embodiments of the disclosure and the characteristics in the embodiments can be combined under the condition of no conflicts. The disclosure is described below with reference to the drawings and the embodiments in detail.

According to one aspect of the disclosure, an integrated circuit's loop is provided, and as shown in FIG. 1 to FIG. 5, the integrated circuit's loop comprises: a passive component part, comprising a power device 20 and/or an execution device 30; and one or more electrical components 10, each of the electrical components comprising a body 11 and multiple pins 12, wherein at least one pin 12 extends to an electrical connecting end of the passive component part, and is electrically connected with the electrical connecting end.

In the integrated circuit's loop of the disclosure, the pins 12 of the electrical components 10 extend to the electrical connecting ends of the passive component part, and are electrically connected with the electrical connecting ends, so that the electrical components 10 are not required to be arranged on a PCB, electrical connection with the passive component part through the PCB is also avoided, a physical structure of the circuit is simplified, a size of the circuit is reduced, BOM (Bill of material) cost is lowered, a requirement on a technician is lowered, and the technician is not required to design the PCB. The integrated circuit' loop is particularly applied as an integrated circuit's loop which is simple in circuit configuration and is applied in small and miniature equipment.

Preferably, the integrated circuit's loop comprises multiple electrical components 10, and the multiple electrical components 10 are connected through the pins 12. The multiple electrical components 10 may be the same electrical components such as a series of diodes or triodes, and may also be different electrical components such as an integrated chip or diodes or triodes.

Preferably, as shown in FIG. 1, at least one pin 12 extends to the electrical connecting end of the passive component part after being bent at least once, and is electrically connected with the electrical connecting end. Preferably, at least one pin 12 of the electrical components 10 is longer than 15 mm.

Figure 2:
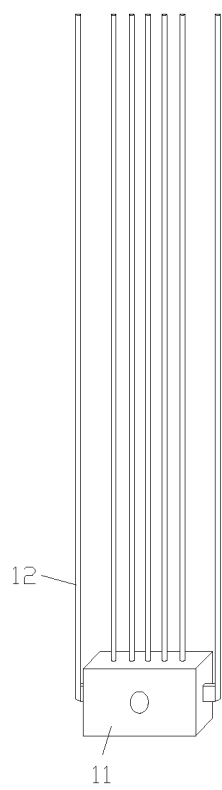
FIG. 2 is a diagram of an initial state of an electrical component in an integrated circuit's loop according to the disclosure.
Figure 3:
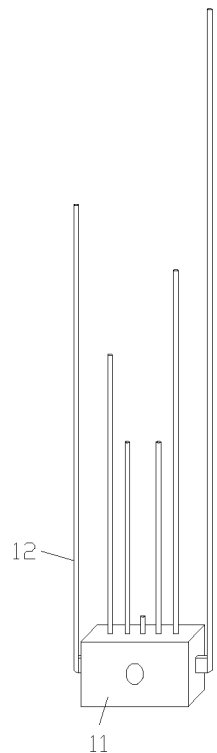
FIG. 3 is a diagram of an electrical component with cut pins in an integrated circuit's loop according to the disclosure.
Figure 4:
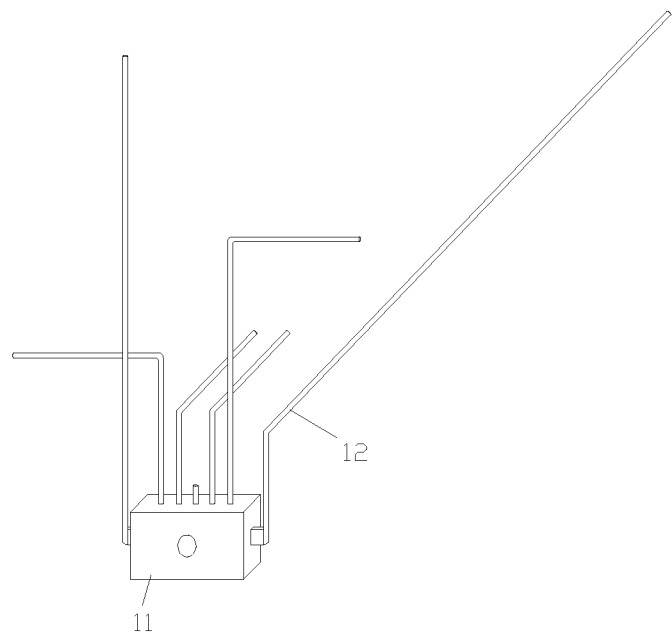
FIG. 4 is a diagram of a state in a bending process of an electrical component in an integrated circuit's loop according to the disclosure.
Figure 5:
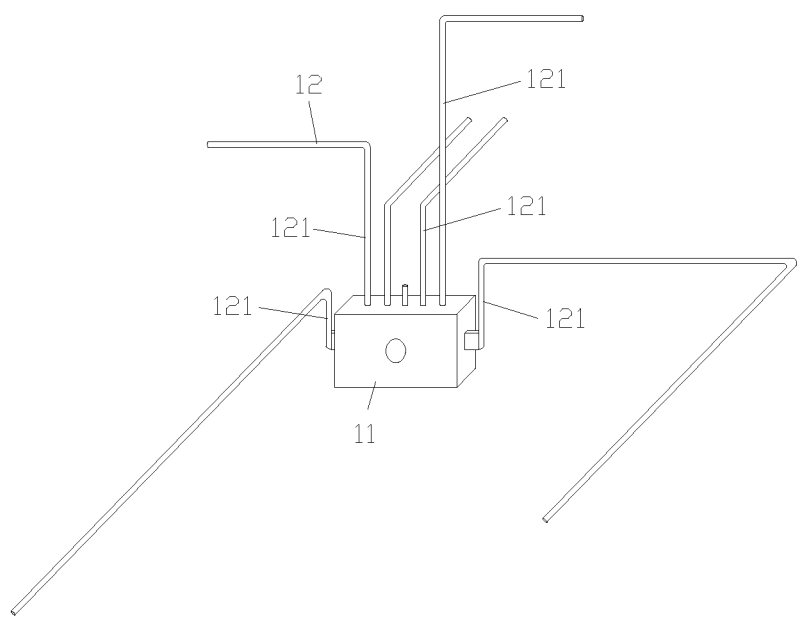
FIG. 5 is a diagram of a state after the bending of an electrical component in an integrated circuit's loop according to the disclosure.

FIG. 2 shows an initial state of an electrical component 10, and each of the pins 12 is not bent, and is longer than 15 mm. The pins 12 of the electrical component 10 in FIG. 3 are cut to be matched with the structure of the integrated circuit's loop. As shown in FIG. 4 and FIG. 5, the pins 12 are bent to extend towards different directions, so that the pins 12 can be directly connected with the connecting ends without wires or other auxiliary leads. In addition, in a practical process of mounting the electrical components 10 and connecting the pins 12, the pins 12 can be sequentially bent and cut.

Preferably, the execution device 30 comprises any one or a combination of multiple of a motor, a sensor, a photographic device, a display device, a sound recording device, a sound reproduction device, a luminous device and a heating device.

Preferably, the electrical components 10 comprise semiconductor components. The semiconductor components comprise integrated chips, diodes, triodes, capacitors, resistors, inductors and the like.

For example, the electrical component 10 shown in FIG. 1 is an integrated chip, comprising four pins 12, and the electrical component shown in FIG. 2 to FIG. 5 is another integrated chip, comprising seven pins 12.

Preferably, as shown in FIG. 1 and FIG. 5, each of the pins 12 of each of the electrical components 10 comprises a first section 121, the first sections 121 are connected with the body 11 of the electrical component 10, and extend towards the same direction, and the first sections 121 of at least two pins 12 are different in length. In FIG. 1 and FIG. 4, different pins 12 extend in sections at different heights without interference.

Preferably, the pin 12 is connected with the electrical connecting end in a splicing, clamping or welding way.

According to another aspect of the disclosure, electrical equipment is also provided, and as shown in FIG. 1, the electrical equipment comprises an integrated circuit's loop, wherein the integrated circuit's loop is the abovementioned integrated circuit's loop.

The integrated circuit's loop of the disclosure has the characteristic of small size so as to be particularly applicable to small and miniature electrical equipment, and the size of the electrical equipment adopting the integrated circuit's loop of the disclosure can further be reduced without performance degradation.

Preferably, the electrical equipment further comprises a support part 110, and the support part 110 supports the pins 12. In order to improve the connecting stability of the circuit in the electrical equipment, the support part 110 are reasonably designed in the electrical equipment, and are used for supporting excessively long pins 12, and for example, when extending lengths of the pins exceed 10 mm, the support part 110 are arranged for the pins 12 under the condition of no influence on the other parts.

Preferably, the electrical equipment further comprises a shell 100, and the support part 110 is formed on the shell 100.

Preferably, the electrical equipment further comprises mounting part for fixing the electrical components 10. Since the electrical components 10 are not fixed on a PCB, the bodies 11 of the electrical components 10 are required to be fixed on the electrical equipment to improve the mounting stability of the electrical components 10. For example, in FIG. 1, a mounting plate 120 is arranged on the shell 100 of the electrical equipment, and the bodies 11 of the electrical components 10 are fixed on the mounting plate 120, thereby realizing the fixation of the electrical components 10. The arrangement of the structures such as the support part 110 or the mounting plate 120 on the electrical equipment can be eliminated, and whether the structures are arranged to strengthen the strength of the electrical equipment and enhance the mounting stability of the electrical components 10 or not can be independently selected by a designer according to an actual need.

According to the embodiment shown in FIG. 1, the electrical equipment shown in FIG. 1 comprises a battery, an integrated chip and a sound reproduction device, wherein the integrated chip comprises four pins, one pin is connected with the battery, and the other two pins are connected with two electrical connecting ends of the sound reproduction device.

Specifically, when a certain type of electrical equipment of the disclosure is designed, the shell 100 of the electrical equipment is designed to achieve reasonable layout and compact structure of the internal components of the electrical equipment according to a power device 20 and an execution device 30, then mounting positions of the electrical components 10 are designed in the shell 100 to enable as many pins 12 as possible to extend to electrical connecting ends of the power device 20 and the execution device 30 and be connected therewith after being bent, the mounting part for mounting the electrical components 10 is arranged according to needs after the mounting positions of the electrical components 10 are determined, and if the extending lengths of the pins 12 are excessively long, the support part 110 is correspondingly designed to support the pins 12.

According to another aspect of the disclosure, a circuit connecting method for an integrated circuit is also provided. The integrated circuit's loop comprises: electrical component 10, comprising a body 11 and multiple pins 12; and a passive component part, comprising a power device 20 and/or an execution device 30. The circuit connecting method comprises: arranging at least one pin 12 of the electrical component in a way that the pin 12 extends to an electrical connecting end of the passive component part and is electrically connected with the electrical connecting end.

Preferably, the circuit connecting method further comprising: bending the pin 12 once or for many times to enable the pin 12 to extend to the electrical connecting end of the passive component part and be electrically connected with the electrical connecting end.

The above is only the preferred embodiment of the disclosure and not intended to limit the disclosure, and for those skilled in the art, the disclosure can have various modifications and variations. Any modifications, equivalent replacements, improvements and the like within the spirit and principle of the disclosure shall fall within the scope of protection of the disclosure.

What is claimed is:

1. Electrical equipment comprising:
    an integrated circuit's loop, wherein the integrated circuit's loop comprises:
        a passive component part comprising a power device and an execution device or a passive component part comprising an execution device; and
        an integrated circuit chip, the integrated circuit chip comprising a body and a plurality of pins, wherein at least one pin directly extends to an electrical connecting end of the execution device and is electrically connected with the electrical connecting end of the execution device, wherein the integrated circuit chip is not in direct contact with a printed circuit board, and wherein the at least one pin of the integrated circuit chip is longer than 15 mm;
        a shell at least partially supporting the integrated circuit chip; and
        a support part supporting at least another pin that is longer than a threshold length but not any other pins that are shorter than the threshold length, wherein the support part is distinct from the printed circuit board, and wherein the threshold length is at least 10 mm,
    wherein at least two pins of the plurality of pins of the integrated circuit chip comprise first sections connected with the body of the integrated circuit chip, the first sections extending in the same direction, and the first sections of the at least two pins being different in length.

2. A circuit connecting method for the integrated circuit's loop of the electrical equipment of claim 1, the method comprising:
    arranging the at least one pin of the integrated circuit chip in a way that the at least one pin extends to the electrical connecting end of the execution device and is electrically connected with the electrical connecting end.

3. The circuit connecting method according to claim 2, further comprising: bending the at least one pin once or more than one time to enable the at least one pin to extend to the electrical connecting end of the execution device and be electrically connected with the electrical connecting end.

4. The electrical equipment according to claim 1, wherein at least one pin extends to the electrical connecting end of the execution device after being bent at least once and is electrically connected with the electrical connecting end.

5. The electrical equipment according to claim 1, wherein the execution device comprises at least one of a motor, a sensor, a photographic device, a display device, a sound recording device, a sound reproduction device, a luminous device, or a heating device.

6. The electrical equipment according to claim 1, wherein the at least one pin is connected with the electrical connecting end in a splicing, clamping or welding way.

7. The electrical equipment according to claim 1, wherein at least some of plurality of pins are not positioned on the support part.

8. The electrical equipment according to claim 1, wherein the threshold length is 10 mm.

* * * * *